United States Patent
Movchan et al.

(10) Patent No.: US 6,790,486 B2
(45) Date of Patent: Sep. 14, 2004

(54) VAPOR DEPOSITION PROCESS

(75) Inventors: Boris A. Movchan, Kyiv (UA); Irene Spitsberg, Loveland, OH (US); Ramgopal Darolia, West Chester, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/064,887

(22) Filed: Aug. 27, 2002

(65) Prior Publication Data

US 2004/0043150 A1 Mar. 4, 2004

(30) Foreign Application Priority Data

Aug. 15, 2002 (UA) .......................................... 02086789

(51) Int. Cl.$^7$ ................................................. C08J 7/18
(52) U.S. Cl. .................. 427/551; 427/595; 427/255.31
(58) Field of Search ................................ 427/551, 595, 427/255.31, 248.1

(56) References Cited

U.S. PATENT DOCUMENTS

| | | | |
|---|---|---|---|
| 6,145,470 A | * 11/2000 | Bruce et al. ......... | 118/723 EB |
| 6,187,453 B1 | * 2/2001 | Maloney ............. | 428/615 |
| 6,251,504 B1 | * 6/2001 | Jaslier et al. ........ | 428/210 |
| 6,346,301 B2 | * 2/2002 | Beele et al. ......... | 427/561 |
| 6,571,857 B2 | * 6/2003 | Darolia et al. ....... | 164/57.1 |

\* cited by examiner

Primary Examiner—Bret Chen
(74) Attorney, Agent, or Firm—David L. Narsico; Gary M. Hartman; Domenida N.S. Hartman

(57) ABSTRACT

A process for depositing a ceramic coating on a component. The process involves a technique for evaporating an evaporation source containing multiple different oxide compounds, at least one of the oxide compounds having a vapor pressure that is higher than the remaining oxide compounds, to deposit a coating of the multiple oxide compounds. A high energy beam is projected onto the evaporation source to melt and form a vapor cloud of the oxide compounds of the evaporation source, while preventing the vapor cloud from contacting and condensing on the component during an initial phase in which the relative amount of the one oxide compound in the vapor cloud is greater than its relative amount in the evaporation source. During a subsequent phase in which the relative amount of the one oxide compound in the vapor cloud has decreased to something approximately equal to its relative amount in the evaporation source, the vapor cloud is allowed to contact and condense on the component to form the coating.

20 Claims, 4 Drawing Sheets

VAPOR DEPOSITION PROCESS

BACKGROUND OF INVENTION

1. Field of the Invention

The present invention generally relates to coating processes. More particularly, this invention is directed to a vapor deposition process and apparatus for depositing ceramic coatings containing multiple oxides with different vapor pressures using a single evaporation source containing the multiple oxides.

2. Description of the Related Art

Higher operating temperatures for gas turbine engines are continuously sought in order to increase their efficiency. However, as operating temperatures increase, the high temperature durability of the components within the hot gas path of the engine must correspondingly increase. Significant advances in high temperature capabilities have been achieved through the formulation of nickel and cobalt-base superalloys. Nonetheless, certain components of the turbine, combustor and augmentor sections of a gas turbine engine can be required to operate at temperatures at which the mechanical properties of such alloys would be insufficient. For this reason, these components are often protected by a thermal barrier coating (TBC) formed of a ceramic material. Because of the different coefficients of thermal expansion (CTE) between ceramic materials and the superalloy substrates they protect, an oxidation-resistant bond coat is typically employed to promote adhesion and extend the service life of a TBC, as well as protect the underlying substrate from damage by oxidation and hot corrosion attack. Bond coats used on superalloy substrates are typically in the form of an overlay coating such as MCrAlX (where M is iron, cobalt and/or nickel, and X is yttrium or another rare earth element), or a diffusion aluminide coating. During the deposition of the ceramic TBC and subsequent exposures to high temperatures, such as during engine operation, these bond coats form a tightly adherent alumina ($Al_2O_3$) layer or scale that adheres the TBC to the bond coat.

Various ceramic materials have been proposed for TBC's, the most notable of which is zirconia ($ZrO_2$) that is partially or fully stabilized by yttria ($Y_2O_3$), magnesia (MgO), another alkaline-earth metal oxides, or ceria ($CeO_2$) or another rare-earth metal oxides. Binary yttria-stabilized zirconia (YSZ) is widely used as a TBC material because of its high temperature capability, low thermal conductivity and erosion resistance in comparison to zirconia stabilized by other oxides. YSZ is also preferred as a result of the relative ease with which it can be deposited by plasma spraying, flame spraying and physical vapor deposition (PVD) techniques. TBC's employed in the highest temperature regions of gas turbine engines are often deposited by PVD, particularly electron beam physical vapor deposition (EBPVD), which yields a columnar, strain-tolerant grain structure that is able to expand and contract without causing damaging stresses that lead to spallation. Similar columnar microstructures can be produced using other atomic and molecular vapor processes, such as sputtering (e.g., high and low pressure, standard or collimated plume), ion plasma deposition, and all forms of melting and evaporation deposition processes (e.g., cathodic arc, laser melting, etc.).

In order for a TBC to remain effective throughout the planned life cycle of the component it protects, it is important that the TBC has and maintains a low thermal conductivity. However, the thermal conductivities of TBC materials such as YSZ are known to increase over time when subjected to the operating environment of a gas turbine engine. As a result, TBC's for gas turbine engine components are often deposited to a greater thickness than would otherwise be necessary. Alternatively, internally cooled components such as blades and nozzles must be designed to have higher cooling flow. Both of these solutions are undesirable for reasons relating to cost, component life and engine efficiency. As a result, it can be appreciated that further improvements in TBC technology are desirable, particularly as TBC's are employed to thermally insulate components intended for more demanding engine designs.

To reduce and stabilize the thermal conductivity of YSZ, ternary YSZ systems have been proposed. For example, commonly-assigned U.S. Pat. No. 6,586,115 to Rigney et al. discloses a TBC of YSZ alloyed to contain certain amounts of one or more alkaline-earth metal oxides (magnesia (MgO), calcia (CaO), strontia (SrO) and barium oxide (BaO)), rare-earth metal oxides (lanthana ($La_2O_3$), ceija ($CeO_2$), neodymia ($Nd_2O_3$), gadolinium oxide ($Gd_2O_3$) and dysprosia ($Dy_2O_3$)), and/or such metal oxides as nickel oxide (NiO), ferric oxide ($Fe_2O_3$), cobaltous oxide (CoO), and scandium oxide ($Sc_2O_3$). According to Rigney et al., when present in sufficient amounts these oxides are able to significantly reduce the thermal conductivity of YSZ by increasing crystallographic defects and/or lattice strains. In commonly-assigned U.S. patent application Serial No. 10/064,785 to Darolia et al., a TBC of YSZ is deposited to contain a third oxide, elemental carbon and potentially carbides and/or a carbon-containing gas. The resulting TBC is characterized by lower density and thermal conductivity, high temperature stability and improved mechanical properties.

While the incorporation of additional oxide compounds into a YSZ TBC in accordance with Rigney et al. and Darolia et al. has made possible a more stabilized TBC microstructures, it can be difficult to deposit a TBC by an evaporation process to produce a desired and uniform composition if the additional oxide has a significantly different vapor pressure than zirconia and yttria. For example, ceria has a vapor pressure of about 10 mbar, in comparison to vapor pressures of about 0.05 mbar for zirconia and yttria at 2500° C. If a YSZ+ceria TBC is to be deposited by EBPVD or another vapor deposition process, evaporating a single ingot containing the desired YSZ+ceria composition deposits a TBC that has an unacceptable nonuniform distribution of ceria. To avoid this result, co-evaporation of oxides having vapor pressures significantly different from YSZ (e.g., at least an order of magnitude higher than YSZ) has been performed with a separate ingot of each additional oxide. If a single electron beam is used, a controlled beam jumping technique must be employed, by which the beam is briefly projected (in the millisecond range) on each ingot, with the amount of time on each ingot being adjusted so that the energy output achieves the energy balance required to obtain compositional control. As an alternative to the use of a single beam, multiple electron guns operated at different power levels have been used to maintain molten pools of each ingot material. However, both of these techniques complicate the deposition process such that the incorporation of additional oxides in a YSZ TBC can be difficult to perform in a commercial setting.

In view of the above, it would be desirable if a process existed that simplified the co-evaporation of oxides with different vapor pressures.

SUMMARY OF INVENTION

The present invention provides a process and apparatus for depositing a ceramic coating, such as a thermal barrier coating (TBC) for a component intended for use in a hostile thermal environment, such as the superalloy turbine, combustor and augmentor components of a gas turbine engine. The process of this invention is particularly directed to an evaporation technique for depositing a TBC formed of a multiple oxide compounds, at least one of which has a vapor pressure that differs from the remaining oxide compounds. An example is in the deposition of a TBC formed of YSZ alloyed with a third oxide to reduce the density and/or thermal conductivity of the TBC, improve high temperature stability, and/or improve mechanical properties.

The invention generally entails providing an evaporation source containing multiple different oxide compounds, at least one of the oxide compounds having a vapor pressure that is higher than the remaining oxide compounds. In a YSZ coating system, examples of particularly suitable oxide compounds are metal oxides of metals such as cerium, gadolinium, neodymium, lanthanum, dysprosium, ytterbium, tantalum, magnesium, calcium, strontium and barium, which have a sufficient absolute percent ion size difference relative to zirconium ions to produce significant lattice strains that promote lower thermal conductivities. The component intended to be coated is suspended near the evaporation source, and a high-energy (e.g., electron or laser) beam is projected onto the evaporation source to melt and form a vapor cloud of the oxide compounds of the evaporation source, while preventing the vapor cloud from contacting and condensing on the component during an initial phase in which the relative amount of the one oxide compound in the vapor cloud is greater than the relative amount of the oxide compound in the evaporation source. For this purpose, a barrier may be physically placed between the component and the evaporation source. During a subsequent phase, in which the relative amount of the oxide compound in the vapor cloud has decreased to something approximately equal to its relative amount in the evaporation source, the vapor cloud is allowed to contact and condense on the component to form the coating. If a barrier was used to initially prevent deposition of the coating, the barrier is removed during this subsequent phase of the evaporation process.

In view of the above, it can be appreciated that the present invention is based on a determination that, at the beginning of an evaporation process using an evaporation source (e.g., ingot) containing multiple oxide compounds including one or more whose vapor pressure is higher than the other oxide compounds, the vapor cloud is rich with the oxide compound with the highest vapor pressure, as a result of the oxide compound evaporating faster than the other oxide compounds. Furthermore, it was determined that over a period of time, the evaporation source becomes enriched in the oxide component(s) having lower vapor pressures (corresponding to lower evaporation rates), with the result that an equilibrium (or near equilibrium) is established in the evaporation process, resulting in a more uniform co-evaporation of the oxide compounds in the evaporation source. As a result, a coating deposited during this phase of the evaporation process will have a composition more nearly equal to that of the evaporation source. Accordingly, a preferred aspect of the present invention is to allow the vapor cloud evaporated from an evaporation source to contact and condense on the article primarily or exclusively during this later phase, producing a coating whose composition is more predictable and uniform than otherwise possible when using a single evaporation source for the multiple oxide compounds.

Other objects and advantages of this invention will be better appreciated from the following detailed description.

DETAILED DESCRIPTION

The present invention is generally applicable to components subjected to high temperatures, such as the high and low pressure turbine nozzles and blades, shrouds, combustor liners and augmentor hardware of gas turbine engines. While the advantages of this invention are particularly applicable to gas turbine engine components, the teachings of this invention are generally applicable to any component on which a TBC may be used to provide protection from a high temperature environment.

TBC's of particular interest to the invention are typically bonded to a substrate, such as a superalloy material, with a metallic bond coat deposited on the substrate. The bond coat is preferably an aluminum-rich composition, such as an overlay coating of an MCrAlX alloy or a diffusion coating such as a diffusion aluminide or a diffusion platinum aluminide of a type known in the art, though it is foreseeable that other bond coat materials and types could be used. As with prior art TBC's, TBC's of this invention are intended to be deposited to a thickness that is sufficient to provide the required thermal protection for the particular component, typically on the order of about 75 to about 300 micrometers, though lesser and greater thicknesses are foreseeable.

Figure 1:
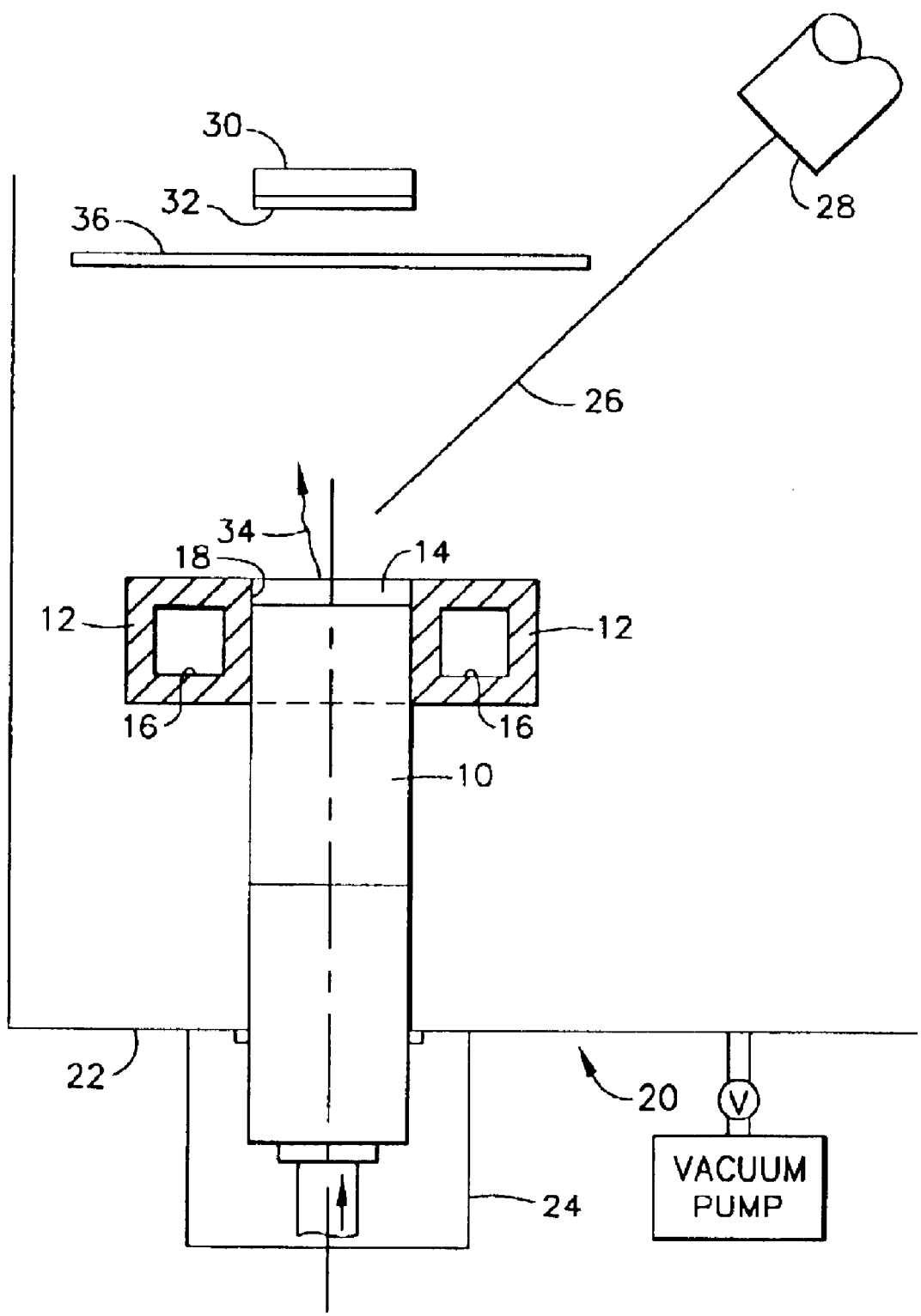
FIG. 1 is a schematic representation of an EBPVD apparatus using a single evaporation source containing multiple oxide compounds, one of which has a significantly higher vapor pressure than the remaining oxide compounds of the source in accordance with one embodiment of the present invention.

To achieve a strain-tolerant grain structure, TBC's are deposited using a physical vapor deposition technique, such as EBPVD, though other evaporation techniques are possible and within the scope of this invention. The EBPVD process requires the presence of an evaporation source formed essentially of the coating composition desired, and an electron beam at an appropriate power level to create a vapor of the evaporation source in the presence of the surface to be coated. FIG. 1 schematically represents a portion of an EBPVD coating apparatus 20, including a coating chamber 22 in which a component 30 is suspended for coating. A TBC 32 is represented as being deposited on the component 30 by melting and vaporizing an ingot 10 of the desired coating material with an electron beam 26 produced by an electron beam gun 28. The intensity of the beam 26 is sufficient to produce a vapor cloud 34 that contacts and then condenses on the component 30 to form the TBC 32. As shown, the vapor cloud 34 evaporates from a pool 14 of molten coating material contained within a reservoir formed by a crucible 12 that surrounds the upper end of the ingot 10. Water or another suitable cooling medium flows through cooling passages 16 defined within the crucible 12 to maintain the crucible 12 at an acceptable temperature. As it is gradually consumed by the deposition process, the ingot 10 is incrementally fed into the chamber 22 through an airlock 24. As a result of the vapor process by which the TBC 32 is deposited, the individual grains of the TBC 32 are characterized by microstructural defects and pores within the grains and at and between the grain boundaries. These defects and pores are believed to decrease the thermal conductivity of the individual TBC grains, and therefore the TBC 32 as a whole.

According to a preferred aspect of the invention, the thermal-insulating material of the TBC 26 is based on binary yttria-stabilized zirconia (YSZ), but alloyed to contain at least a third metal oxide. The invention particularly pertains to the deposition by evaporation of YSZ-based coatings in which one or more of the additional metal oxides have a vapor pressure that differs significantly from zirconia and yttria, e.g., at least an order of magnitude. Though not a necessary feature of the invention, the third oxide preferably has the effect of reducing and/or stabilizing the thermal conductivity of the TBC 32. For this purpose, and in accordance with commonly-assigned U.S. Pat. No. 6,586, 115 to Rigney et al., the third oxide preferably has an absolute percent ion size difference relative to zirconium ions of at least that of an yttrium anion ($Y^{3+}$). i.e., at least 13 percent, so as to produce significant strains due to ionic size. In accordance with commonly-assigned U.S. patent application Ser. No. 10/064,785 to Darolia et al., the TBC 32 may be further modified to contain elemental carbon in the form of precipitate clusters, from which may evolve a carbon-containing gas (e.g., carbon monoxide (CO) and/or carbon dioxide ($CO_2$)) as a result of thermal decomposition of carbon. In combination, the presence of elemental carbon. clusters and one or more of the above-specified third metal oxides is believed to reduce the density and thermal conductivity of a YSZ TBC.

The TBC 32 preferred for this invention preferably contains about 3 to about 8 weight percent yttria, though lesser or greater amounts of yttria could be used. Examples of suitable oxide compounds to be alloyed with YSZ are metal oxides such as cerium, gadolinium, neodymium, lanthanum, dysprosium, ytterbium, tantalum, magnesium, calcium, strontium and barium, which have vapor pressures that differ significantly from zirconia and yttria. For example, ceria, neodymia, lanthana, ytterbia, magnesia, strontia and barium oxide are all believed to have vapor pressures higher than zirconia and yttria, some more than an order of magnitude higher. Based on the teachings of Rigney et al. and Darolia et al., ceria in amounts of about 10 to about 20 weight percent of the TBC 32 is believed to be particularly beneficial, though it is foreseeable that lower and higher levels of ceria could be used.

Figure 2:
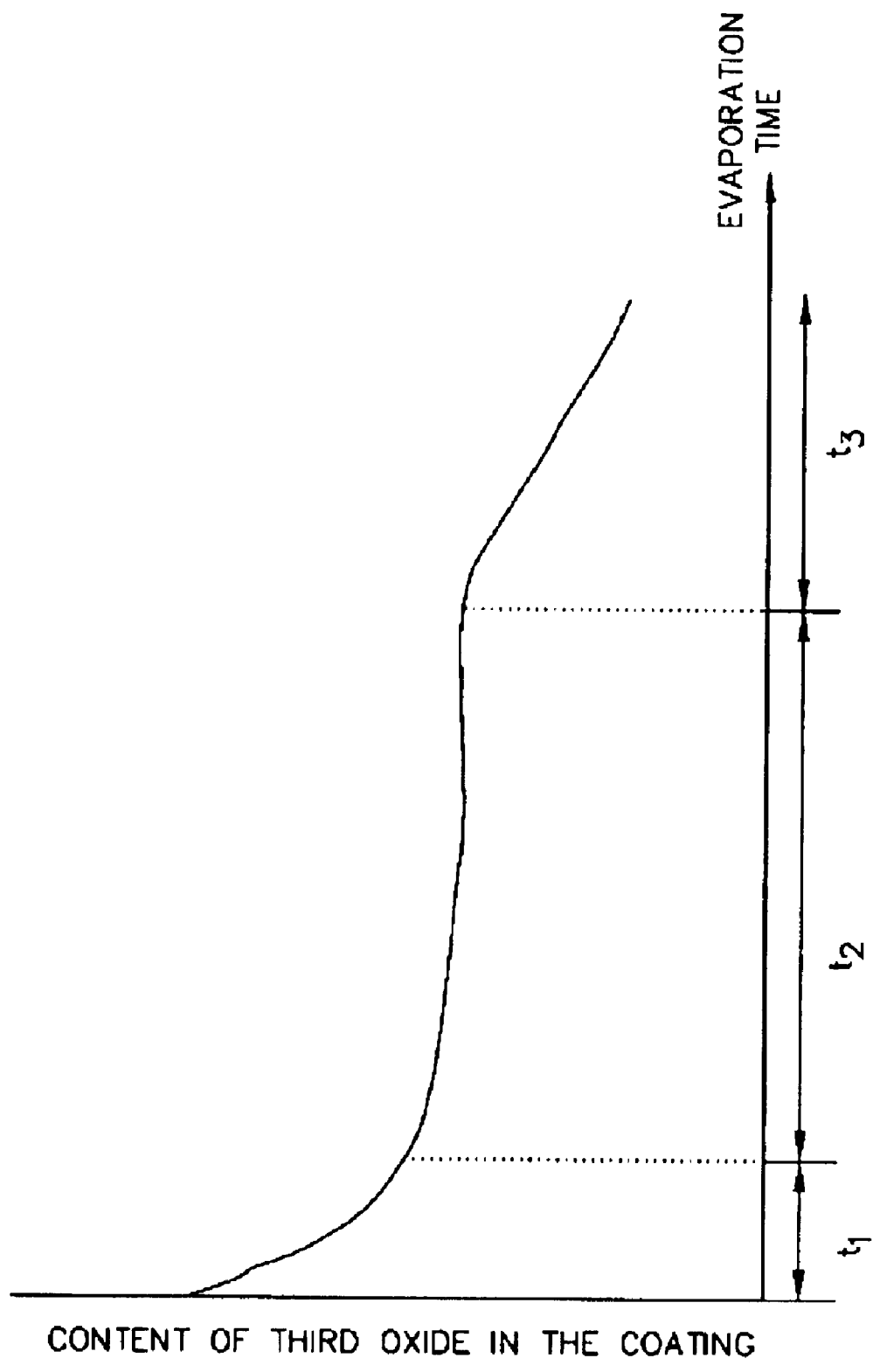
FIG. 2 is a graph representing the concentration in a coating of the oxide compound with the higher vapor pressure, plotted relative to time during the coating process.

According to the present invention, YSZ and ceria (or another high vapor pressure oxide) are simultaneously evaporated from a single ingot 10 having the desired composition for the coating 32, even though prior art attempts to co-evaporate YSZ and ceria have produced coatings whose compositions are not uniform or consistent with the composition of the ingot as a result of the higher vapor pressure of ceria. In an investigation leading to this invention, an ingot containing YSZ alloyed with about 16 weight percent ceria was evaporated by EBPVD to deposit a TBC. With reference to FIG. 2, analysis of the coating indicated that the portion of the TBC deposited at the beginning of the evaporation process ($t_1$) was rich in ceria. The ceria content dropped through the initial thickness of the TBC, corresponding to a coating duration of about ten minutes, after which the ceria content was relatively stable within the coating ($t_2$) before dropping off near the end of the coating operation ($t_3$). From this investigation, it was concluded that the vapor cloud 34 within the coating chamber is initially rich in ceria ions as a result of the higher vapor pressure of ceria (corresponding to a higher evaporation rate). However, after a period of time ($t_1$) an equilibrium (or near equilibrium) appeared to become established in the evaporation process, resulting in a more uniform co-evaporation of YSZ and ceria from the ingot. While not wishing to be held to any particular theory, it was concluded that the ingot had become sufficiently enriched in YSZ as a result of the lower evaporation rates of yttria and zirconia (resulting from their relatively lower vapor pressures), that the apparent equilibrium was established for the evaporation rates of zirconia, yttria and ceria. The final drop-off of the ceria content in the coating ($t_3$) was attributed to the remainder of the ingot being rich in YSZ from the earlier accelerated lose of ceria without any additional ceria available from the bulk of the ingot.

On this basis, it was concluded that a TBC 32 deposited during the intermediate phase ($t_2$) of the evaporation process can have a composition more nearly equal to that of the ingot. Accordingly, an object of the invention is to allow the vapor cloud 34 evaporated from the ingot 10 to contact and condense on the component 30 primarily or exclusively during this intermediate phase, to produce a TBC 32 whose composition is more predictable and uniform than otherwise possible when using a single evaporation source. With reference again to FIG. 1, the EBPVD apparatus 20 is depicted as including a barrier 36 that is shown to be positioned between the component 30 and the molten pool 14, representative of the initial or latter phases of the coating process in which the proportional composition of the vapor cloud 34 differs from the ingot 10. A suitable barrier 36 is a stainless steel plate that can be maneuvered from outside the coating chamber 22. One approach to using the barrier 36 is to determine the $t_1$" and $t_2$" time periods for a given ingot composition, and then programming the apparatus 20 to withdraw the barrier 36 at $t_1$ following startup of the coating process. The barrier 36 can be later reinserted or the evaporation process simply terminated at the end of $t_2$ before evaporation occurs of the YSZ-rich remainder of the ingot 10. Alternatively, the operation of the apparatus could be automated based on sensing the chemistry of the vapor cloud 34.

While the use of a physical barrier 36 is a particularly effective technique for limiting deposition to the intermediate phase ($t_2$) of the coating process, other techniques are possible. For example, deposition of a coating rich in the higher vapor pressure constituent(s) of the ingot 10 can be avoided by performing the initial phase ($t_1$) of the coating process as a separate run, during which the component 30 has not yet been placed in the chamber 22. Deposition of a coating rich in the lower vapor pressure constituent(s) of the ingot 10 can be avoided by terminating the coating process prior to entering the final phase ($t_3$), i.e., before evaporation occurs of the final portion of the ingot 10 that is rich in the lower vapor pressure constituent(s). Furthermore, the latter phase ($t_3$) of the coating process can be effectively postponed as long as ingot material is continuously fed into the chamber 22.

Figure 3:
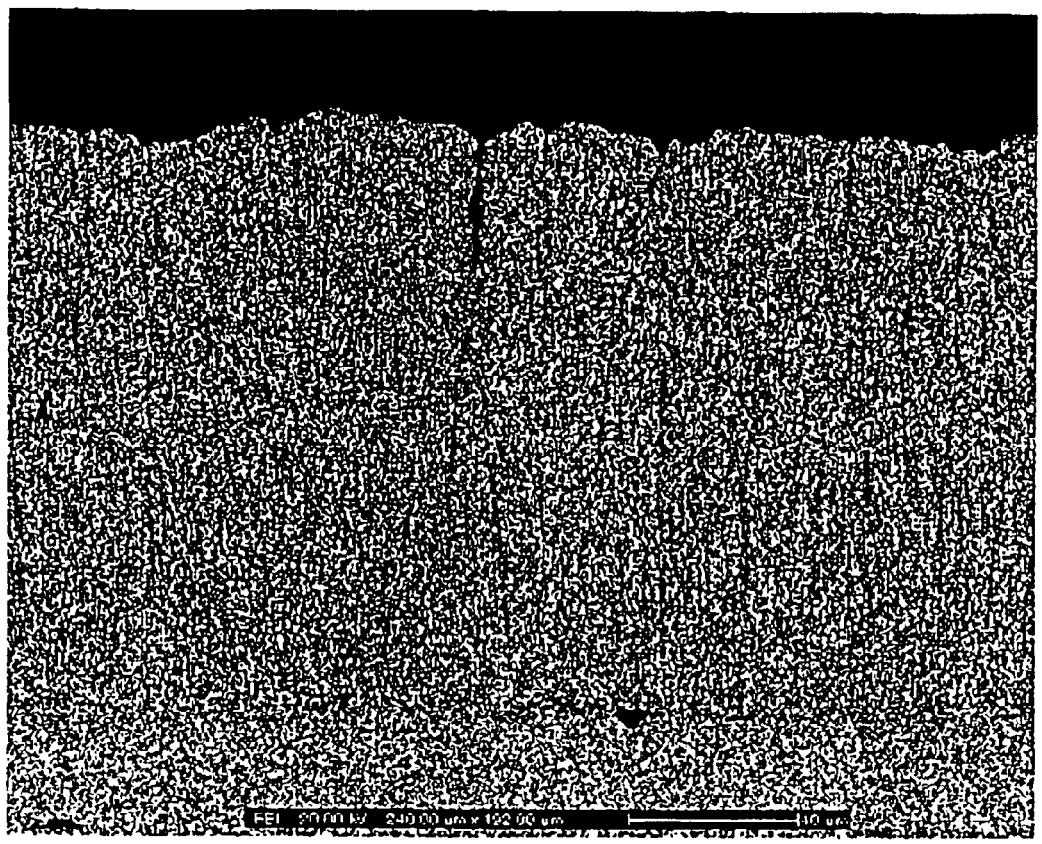
FIG. 3 is a microphotograph of a cross-section through a thermal barrier coating deposited in accordance with the present invention.
Figure 4:
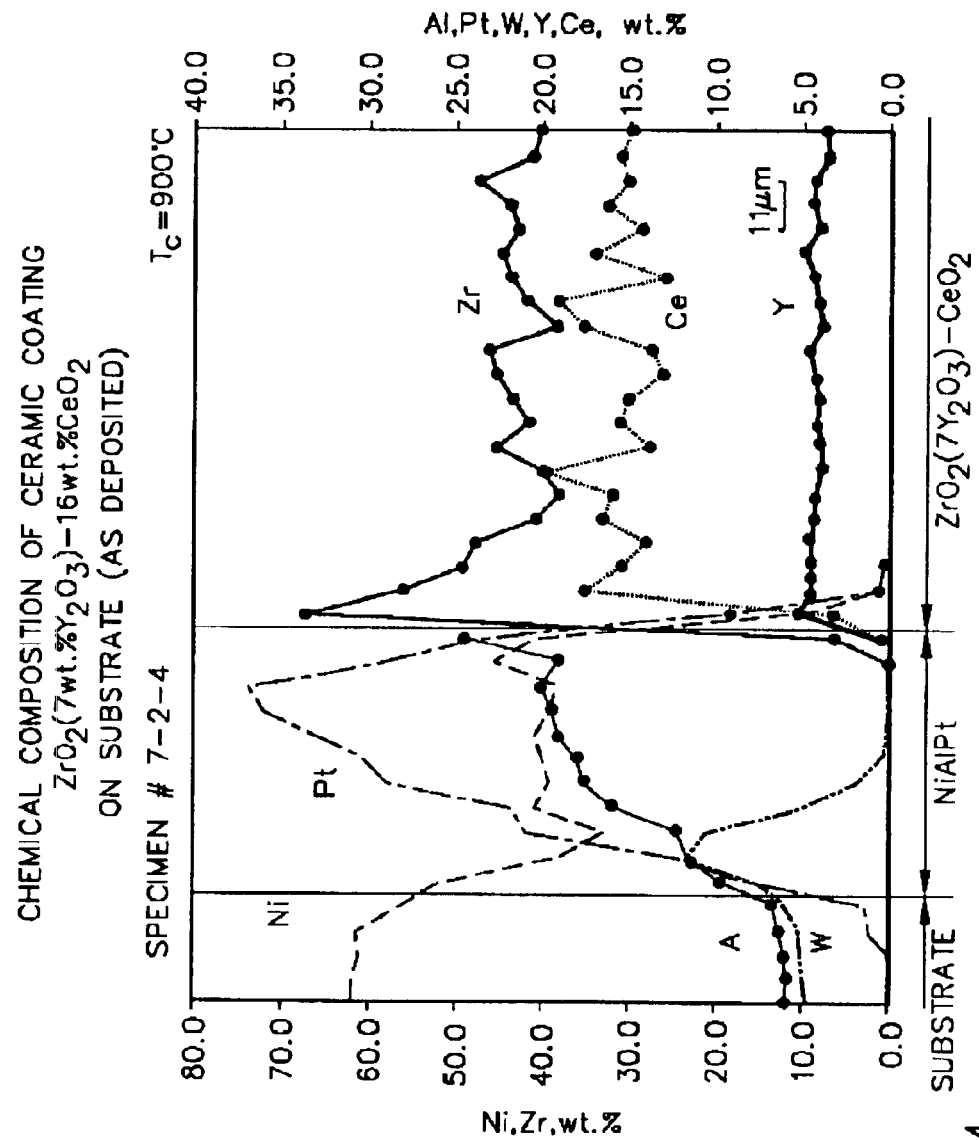
FIG. 4 is a graph of the chemical composition of a thermal barrier coating deposited in accordance with the present invention.

In a second investigation leading to this invention, TBC's were deposited by EBPVD on specimens formed of the superalloy Ren é N5 on which a platinum aluminide (PtAl) diffusion bond coat had been deposited. The specimens were coated by evaporating an ingot of zirconia stabilized by about seven weight percent yttria (7% YSZ) alloyed with about 16 weight percent ceria. The specimens were loaded into a coating chamber so as to be supported above the ingot, and the chamber evacuated to achieve a partial vacuum of about $10^{-4}$ Torr (about $1.3 \times 10^{-4}$ mbar). The specimens were then heated to a temperature of about 900° C. While rotating the specimens at a rate of about 25 rpm, the ingot was evaporated using an electron beam gun operated at a constant power level of about 24.5 kW. During an initial period of about 10 minutes, the vapor cloud produced by the evaporation process was prevented from contacting and condensing on the component with a barrier of the type represented in FIG. 1. Coating was then permitted for a duration of about 40 minutes by removing the barrier, after which the barrier was reintroduced to again prevent deposition on the specimens. A TBC deposited under these conditions is shown in FIG. 3 to have a desirable columnar microstructure, while FIG. 4 evidences that the elemental distribution throughout the thickness of the TBC was substantially uniform. FIG. 4 shows that, relative to their stabilized levels in the bulk of the TBC, the zirconium level was relatively high and the cerium level relatively low in the first several micrometers of the TBC. The cause of this variance is not understood, and in any event would not have a detrimental effect on the desired properties for the TBC.

While the invention has been described in terms of a preferred embodiment, it is apparent that other forms could be adopted by one skilled in the art. For example, instead of depositing the TBC by EBPVD, other vapor deposition processes could be used. Accordingly, the scope of the invention is to be limited only by the following claims.

What is claimed is:

1. A process of depositing a ceramic coating on a surface of a component, the process comprising the steps of:

providing an evaporation source containing multiple different oxide compounds, at least one of the oxide compounds having a vapor pressure that is higher than the remaining oxide compounds;

suspending the component near the evaporation source;

projecting a high-energy beam on the evaporation source to simultaneously melt the oxide compounds of the evaporation source and form a vapor cloud of the oxide compounds while preventing the vapor cloud from contacting and condensing on the component during an initial phase in which the relative amount of the at least one oxide compound in the vapor cloud is greater than the relative amount of the at least one oxide compound in the evaporation source; and then allowing the vapor cloud to contact and condense on the component to form the coating during a subsequent phase in which the relative amount of the at least one oxide compound in the vapor cloud is approximately equal to the relative amount of the at least one oxide compound in the evaporation source, whereby the coating deposited during the subsequent phase has a substantially uniform distribution of the at least one oxide compound.

2. A process according to claim 1, wherein the vapor cloud is prevented from contacting and condensing on the component during the initial phase by placing a barrier between the component and the evaporation source, and the vapor cloud is allowed to contact and condense on the component during the subsequent phase by removing the barrier from between the component and the evaporation source.

3. A process according to claim 1, further comprising the step of preventing the vapor cloud from contacting and condensing on the component during a final phase in which the relative amount of the at least one oxide compound in the vapor cloud is lower than the relative amount of the at least one oxide compound in the evaporation source.

4. A process according to claim 1, wherein the at least one oxide compound is selected from the group consisting of ceria, magnesia, strontia, barium oxide, lanthana, neodymia, gadolinium oxide, dysprosia, ytterbia and tantala.

5. A process according to claim 4, wherein the evaporation source consists essentially of yttria, zirconia and the at least one oxide compound.

6. A process according to claim 5, wherein the at least one oxide compound is ceria.

7. A process according to claim 1, wherein the evaporation source consists essentially of yttria, zirconia and the at least one oxide compound.

8. A process according to claim 1, wherein the at least one oxide compound is ceria.

9. A process according to claim 1, wherein the evaporation source contains about 10 to about 20 weight percent ceria, the balance essentially zirconia stabilized by about 3 to about 8 weight percent yttria.

10. A process of depositing a thermal barrier coating on a surface of a gas turbine engine component, the process comprising the steps of:

depositing a bond coat on the component;

placing the component in a coating chamber containing a single ingot comprising zirconia, yttria and at least a third oxide compound having a vapor pressure that is at least an order of magnitude higher than zirconia and yttria; and then projecting an electron beam on the ingot to simultaneously melt the zirconia, yttria and the third oxide compound within the ingot and form a vapor cloud of zirconia, yttria and the third oxide compound while preventing the vapor cloud from contacting and condensing on the component during an initial phase in which the relative amount of the third oxide compound in the vapor cloud is higher than the relative amount of the third oxide compound in the ingot; and then after the relative amount of the third oxide compound within the vapor cloud has dropped and then stabilized, allowing the vapor cloud to continuously contact and condense on the component to form the thermal barrier coating and so that the third oxide compound is uniformly distributed in the thermal barrier coating in an amount approximately equal to the relative amount of the third oxide compound in the ingot.

11. A process according to claim 10, wherein after the amount of the third oxide compound within the vapor cloud has dropped and stabilized, the relative amount of the third oxide compound in the vapor cloud is approximately equal to the relative amount of the third oxide compound in the ingot.

12. A process according to claim 10, wherein the vapor cloud is prevented from contacting and condensing on the component during the initial phase by placing a barrier between the component and the ingot, and the vapor cloud is allowed to contact and condense on the component during the subsequent phase by removing the barrier from between the component and the ingot.

13. A process according to claim 10, further comprising the step of preventing the vapor cloud from contacting and condensing on the component during a final phase in which the relative amount of the third oxide compound in the vapor cloud is lower than the relative amount of the third oxide compound in the ingot.

14. A process according to claim 10, wherein the third oxide compound is selected from the group consisting of ceria, magnesia, strontia, barium oxide, lanthana, neodymia, gadolinium oxide, dysprosia, ytterbia and tantala.

15. A process according to claim 14, wherein the ingot consists essentially of yttria, zirconia and the third oxide compound.

16. A process according to claim 15, wherein the third oxide compound is ceria.

17. A process according to claim 10, wherein the ingot consists essentially of yttria, zirconia and the third oxide compound.

18. A process according to claim 10, wherein the third oxide compound is ceria.

19. A process according to claim 10, wherein the ingot contains about 10 to about 20 weight percent ceria, the balance essentially zirconia stabilized by about 3 to about 8 weight percent yttria.

20. A process according to claim 10, wherein the thermal barrier coating has a microstructure of columnar grains.

* * * * *